United States Patent [19]
Yasuda

[11] Patent Number: 5,528,191
[45] Date of Patent: Jun. 18, 1996

[54] LOGARITHMIC AMPLIFIER HAVING IMPROVED SPEED RESPONSE

[75] Inventor: Hiroaki Yasuda, Kanagawa, Japan

[73] Assignee: Fuji Photo Film Co., Ltd., Kanagawa, Japan

[21] Appl. No.: 527,202

[22] Filed: Sep. 12, 1995

[30] Foreign Application Priority Data

Sep. 12, 1994 [JP] Japan .................................. 6-216861

[51] Int. Cl.$^6$ .............................. H03G 11/08; G06G 7/24
[52] U.S. Cl. .............................................. 327/350; 327/561
[58] Field of Search ..................................... 327/350, 351, 327/352, 346, 560, 561, 562, 563, 362, 363

[56] References Cited

U.S. PATENT DOCUMENTS

| | | | |
|---|---|---|---|
| 3,790,819 | 2/1974 | Chamran | 327/352 |
| 3,965,344 | 6/1976 | Romo | 327/350 |
| 3,971,984 | 7/1976 | Bench | 327/350 |
| 5,126,846 | 6/1992 | Niimura | 327/350 |

FOREIGN PATENT DOCUMENTS

2-277181  11/1990  Japan ................................ G06G 7/24

Primary Examiner—Toan Tran
Attorney, Agent, or Firm—Sughrue, Mion, Zinn, Macpeak & Seas

[57] ABSTRACT

A logarithmic amplifier includes an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller. To improve the high-speed response characteristics of the logarithmic operational amplifier, the operational amplifier is made up of a composite amplifier consisting of an FET input type operational amplifier and a bipolar input type operational amplifier.

5 Claims, 6 Drawing Sheets

LOGARITHMIC AMPLIFIER HAVING IMPROVED SPEED RESPONSE

BACKGROUND OF THE INVENTION

1. Field of the Invention

The present invention relates to a logarithmic amplifier and, more particularly, to a logarithmic amplifier designed to make it faster.

2. Description of the Prior Art

Current signals having a very wide range, such as output signals from a photodetector which reads, for example, a high gradation image, are often subjected to logarithmic amplification in order to make the current signals easy to handle, by compressing the range. As disclosed in Unexamined Japanese Patent Publn. No. Hei-2(1990)-277181, one of known logarithmic amplifiers for carrying out logarithmic amplification has an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller.

The logarithmic amplifier of this type is designed so as to achieve stable operation and high-speed response by increasing the amount of feedback of high frequency components when the operation of the amplifier is prone to become unstable when receiving a large input current. Contrary to this, if the logarithmic amplifier has no problem of operation stability but a problem of response characteristics when receiving a small input current, the amount of feedback of the high frequency components is suppressed. As a result of this, the stable operation and improved high-speed response characteristics of the circuit can be obtained at the same time.

To increase the high-speed response of such a conventional logarithmic amplifier to a much greater extent, it is necessary to construct an operational amplifier itself of an operational amplifier having superior high-speed characteristics. As an operational amplifier having superior high-speed characteristics, a bipolar input type amplifier is known. The conventional logarithmic amplifier has a circuit configuration for reducing the amount of feedback by way of the oscillation prevention circuit as an input current becomes smaller. An input bias current causes an error in the conventional logarithmic amplifier having the previously mentioned configuration. In practice, there is no alternative but to use an FET input type operational amplifier having a small input bias current in view of accuracy, and it has been impossible to use a bipolar input type operational amplifier. For this reason, it has been difficult for the conventional logarithmic amplifier to obtain sufficient high-speed response characteristics.

SUMMARY OF THE INVENTION

In view of the foregoing descriptions, the object of the present invention is to provide a logarithmic amplifier which has sufficient high-speed characteristics as well as implementing stable operation.

According to a first aspect of this invention, the above object is achieved by a logarithmic amplifier including an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller, the improvement being characterized in that the operational amplifier is made up of a composite operational amplifier including an FET input type operational amplifier and a bipolar input type operational amplifier.

In this logarithmic amplifier having the previously mentioned configuration, the use of the bipolar input type operational amplifier having superior high-speed characteristics results in improved high-speed response characteristics. On the other hand, the use of the FET input type operational amplifier having a small input bias current makes it possible to prevent significant errors.

In one preferred embodiment of the present invention, an input stage made of an FET transistor should preferably be connected to an input stage of the bipolar input type operational amplifier.

Moreover, in this logarithmic amplifier, since the input stage made of an FET transistor is connected to the input stage of the bipolar type input operational amplifier, the input stage decreases the influence of the input bias current and current noise of the bipolar input type operational amplifier to a very low level, whereby the prevention of errors and noise is ensured further.

According to a second aspect of the present invention, this invention provides a logarithmic amplifier including an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller, the improvement being characterized in that the operational amplifier is a bipolar type operational amplifier connected to an input stage made of an FET transistor.

In the logarithmic amplifier having the previously mentioned configuration, the use of the bipolar input type operational amplifier having superior high-speed characteristics results in improved high-speed response characteristics. On the other hand, since the input stage made of an FET transistor is connected to the input stage of the bipolar type input operational amplifier, the input stage decreases the influence of the input bias current and current noise of the bipolar type operational amplifier, whereby the significant errors and noise are prevented.

According to a third aspect of the present invention, this invention provides a logarithmic amplifier provided with an operational amplifier, an element for logarithmic conversion purposes connected to a feedback circuit of the amplifier, and an oscillation prevention circuit having a capacitor connected in parallel with the logarithmic conversion element, the improvement characterized in that the operational amplifier is made of a composite amplifier which comprises an FET input type operational amplifier and a bipolar input type operational amplifier, and the bipolar input type operational amplifier is provided with a minor feedback circuit which is different from the feedback circuit connected to the logarithmic conversion element.

The previously mentioned minor feedback circuit is a feedback circuit only associated with the previously mentioned bipolar input type operational amplifier.

The logarithmic amplifier should preferably be provided with a control circuit for controlling the oscillation prevention circuit in such a way that the amount of feedback by way of the oscillation prevention circuit is reduced as an input current to the operational amplifier becomes smaller.

As with the logarithmic amplifier according to the first aspect of the present invention, the use of the bipolar input type operational amplifier having superior high-speed characteristics results in improved high-speed response characteristics. On the other hand, the use of the FET input type operational amplifier having a small input bias current makes it possible to prevent significant errors.

In this logarithmic amplifier, the bipolar input type operational amplifier is provided with a minor feedback circuit which is different from the feedback circuit connected to the logarithmic conversion element. Hence, in the composite amplifier consisting of the bipolar input type operational amplifier and the FET input type operational amplifier, the frequency domain covered by the bipolar input type operational amplifier for high frequency purposes becomes narrow, thereby realizing a logarithmic amplifier with low noise. Hereinbelow, the reduction of noise will be described with reference to FIGS. 6 and FIGS. 7A and 7B.

Figure 6:
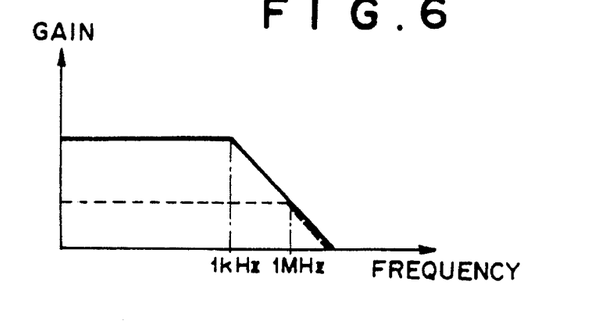
FIG. 6 is an explanatory view illustrating variations in frequency characteristics of a bipolar input type operational amplifier.

Frequency characteristics of an open loop of the bipolar input type operational amplifier, when the logarithmic amplifier is not provided with the minor feedback circuit, are designated by a solid line as shown in FIG. 6. On the assumption that the frequency of a pole at this time is, for example, 1 kHz, if the above mentioned minor feedback circuit is added to the bipolar input type operational amplifier, the frequency characteristics of the bipolar input type amplifier will change so that they become as designated by a broken line as shown in FIG. 6. The frequency of the pole changes to, for example, 1 MHz.

Figure 7A:
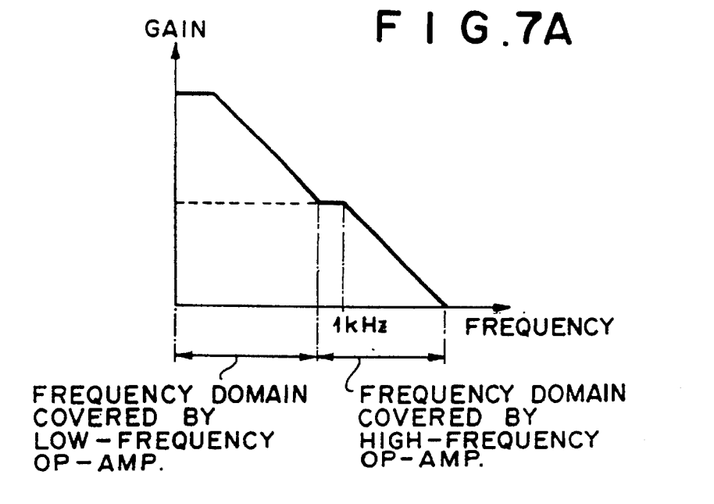
FIGS. 7A and 7B are explanatory views illustrating variations in frequency characteristics of a composite amplifier consisting of a bipolar input type operational amplifier and an FET input type operational amplifier.
Figure 7B:
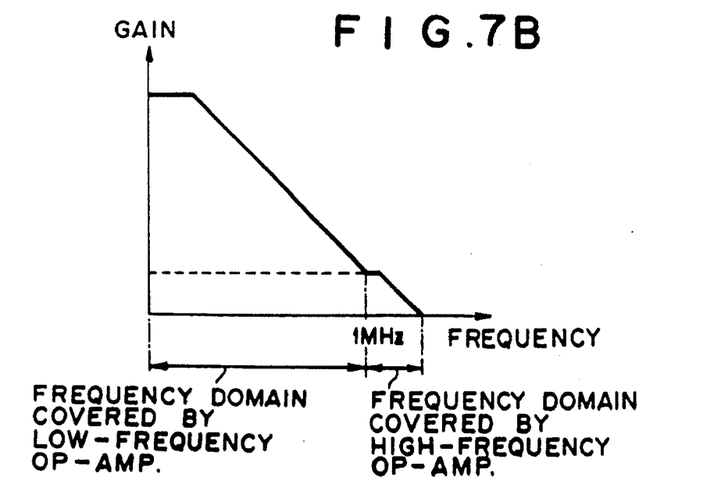

On the assumption that the frequency characteristics of the open loop of the composite amplifier, consisting of the FET input type operational amplifier for lower frequency purposes and the bipolar input type operational amplifier for high frequency purposes, are the same as shown in FIG. 7A, then when the composite amplifier is not provided with the minor feedback circuit, the use of the minor feedback circuit results in the characteristics as shown in FIG. 7B. In other words, the frequency domain covered by the bipolar input type operational amplifier for high frequency use will be made narrower from the domain of more than 1 kHz to the domain of more than 1MHz after the addition of the minor feedback circuit.

Current noise of the operational amplifier is the major contributor to the noise characteristics of the logarithmic amplifier which handles a microcurrent. Generally, the current noise of the bipolar input type operational amplifier is larger than the current noise of the FET input type operational amplifier. If the frequency domain occupied by the bipolar input type operational amplifier having large current noise is made narrower, the noise of the logarithmic amplifier will be reduced.

DESCRIPTION OF THE PREFERRED EMBODIMENTS

With reference to the accompanying drawings, the preferred embodiments of the present invention will now be described in detail hereinbelow.

Figure 1:
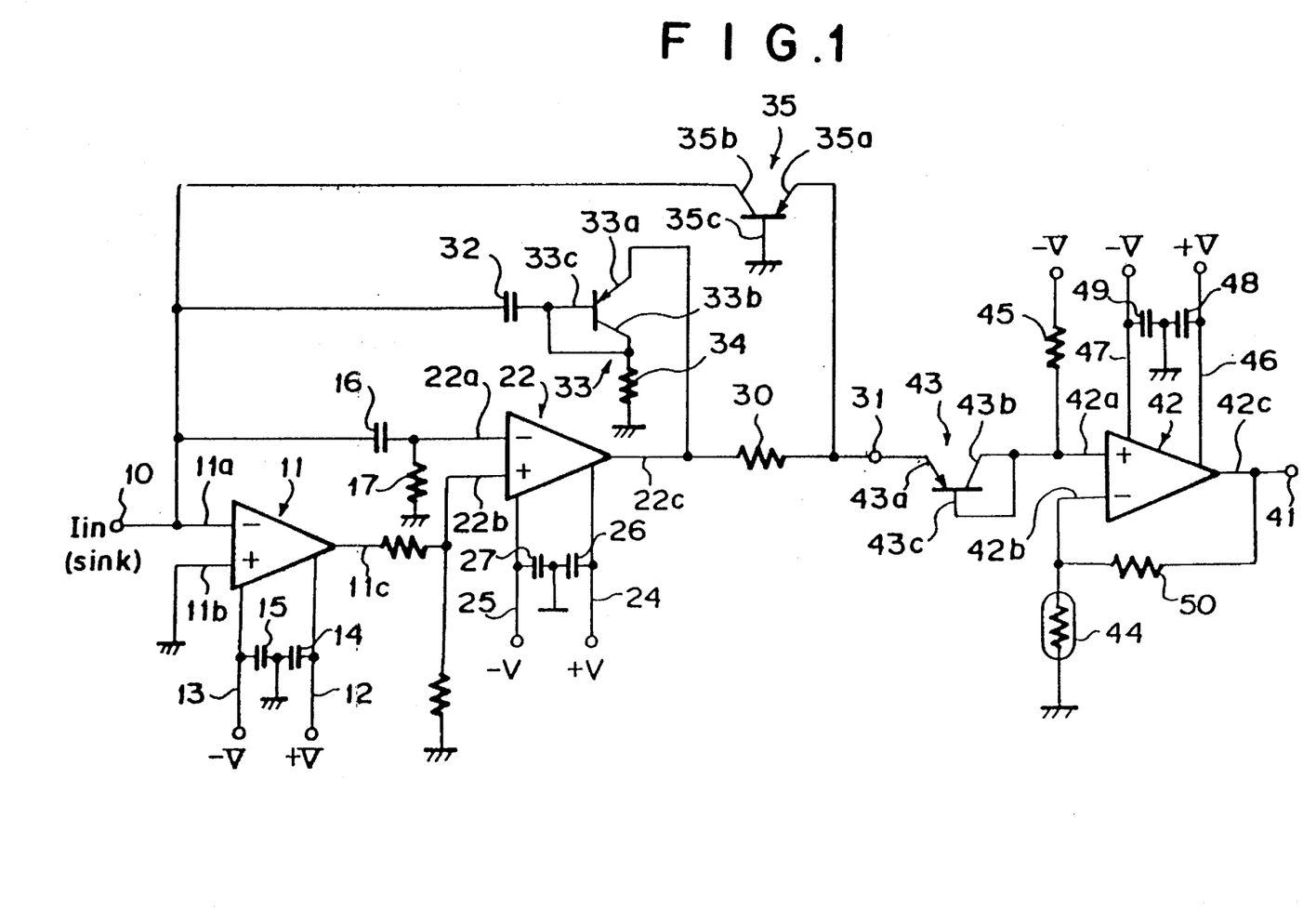
FIG. 1 is a circuit diagram showing a logarithmic amplifier according to a first embodiment of the present invention.

FIG. 1 illustrates a logarithmic amplifier according to a first embodiment of the present invention. As shown in the drawing, an input terminal 10 of the logarithmic amplifier is connected to a negative input terminal 11a of an FET input type operational amplifier 11. On the other hand, a positive input terminal 11b of the operational amplifier 11 is grounded. This operational amplifier 11 is also supplied with two d.c. power supplies, i.e., a +V voltage and a −V voltage. The power supply lines 12 and 13 are grounded via noise prevention capacitors 14 and 15, respectively. The operational amplifier 11 is provided with an offset control circuit.

The input terminal 10 is also connected to a negative input terminal 22a of a bipolar input type operational amplifier 22 via a capacitor 16. A positive input terminal 22b of the operational amplifier 22 is connected to an output terminal 11c of the FET input type operational amplifier 11. One end of a resistor 17 is connected to the negative input terminal 22a of the operational amplifier 22. The operational amplifier is supplied with two d.c. power supplies, i.e., a +V voltage and a −V voltage. The power supply lines 24 and 25 are grounded via noise prevention capacitors 26 and 27, respectively. Though not shown in the drawing, the operational amplifier 22 may also be provided with an offset control circuit.

Am output terminal 22c of the bipolar type input operational amplifier 22 is connected to an output terminal 31 of the first stage via a resistor 30. An oscillation prevention capacitor 32 and a PNP transistor 33b, which are connected in series with each other, are connected between the input terminal 10 and the output terminal 22c of the operational amplifier 22. An emitter 33a and a collector 33c of the PNP transistor 33 are connected to the output terminal 22c of the operational amplifier 22 and one end of a resistor 34, respectively. The other end of the resistor 34 is grounded. A base 33c of the PNP transistor 33 is connected to its collector 33b and further connected to one end of the capacitor 32.

A PNP transistor 35 having exponential characteristics is connected between the input terminal 10 and the first-stage output terminal 31. An emitter 35a and a collector 35b of the PNP transistor 35 are connected to the output terminal 31 and the input terminal 21, respectively. A base 35c is grounded.

When a current signal Iin is input to the input terminal 10 of the logarithmic amplifier having the previously mentioned configuration, an output voltage (a positive voltage), corresponding to a logarithmic value of the current signal Iin, appears on the output terminal 31.

A circuit of the second stage, constructed between the output terminal 31 of the first stage and an output terminal 41 of the logarithmic amplifier, is intended to compensate the temperature of a logarithmic conversion circuit of the first stage. An emitter 43a of a transistor 43, which has the same characteristics as the feedback transistor 35, is connected to the output terminal 31 of the first stage. A collector 43b of that transistor 43 is connected to a positive input terminal 42a of an operational amplifier 42 of the second stage together with a base 43c. The transistor 43 serves as an input impedance of the operational amplifier 42 of the second stage. Since the transistor having the same characteristics as the feedback transistor 35 of the first stage is used as the transistor 43, this transistor 43 contributes to the compensation of the temperature of the logarithmic conversion circuit of the first stage together with an element 44, for temperature compensation purposes, which will be described later. The positive input terminal 42a is connected to the −V power supply via a resistor 45.

As with the operational amplifier 22, two power supplies, that is, a +V power supply and a −V power supply, are connected to the operational amplifier 42. Power supply lines 46 and 47 are grounded via capacitors 48 and 49, respectively. A resistor 50 is connected between the negative input terminal 42b and an output terminal 42c of the operational amplifier 42. The negative input terminal 42b is grounded via the temperature compensation element 44.

When a signal (positive voltage) having been subjected to logarithmic conversion in the circuit of the first stage is input to the circuit of the second stage having the previously mentioned configuration, variations in an output value caused by temperature variations are corrected, and an appropriately amplified signal is output from the output terminal 41.

An output voltage (positive voltage) appearing at the output terminal 22c of the operational amplifier 22 is input to the transistor 33 as well as to the operational amplifier 42 of the second stage. As a higher voltage is applied to the emitter 33a of the transistor 33, the resistance value between the emitter and the collector decreases. As a result of this, the amount of feedback via the capacitor 32 becomes larger, so that the circuit operation becomes stable. On the other hand, as the voltage applied to the emitter 33a of the transistor 33 becomes smaller, the resistance value between the emitter and the collector increases. As a result of this, the amount of feedback via the capacitor 32 becomes smaller, whereby the frequency response characteristics of the circuit are improved.

The logarithmic amplifier according to the first embodiment uses an FET input type operational amplifier 11 having a small input bias current, and hence it is possible to prevent the occurrence of significant errors in the same manner as in the conventional logarithmic amplifier. On the other hand, the use of the bipolar input type operational amplifier 22 having superior high-speed characteristics results in improved high-speed response characteristics. For example, in the case of the conventional logarithmic amplifier which uses only the FET input type operational amplifier, the frequency response characteristics are restricted to 400 KHz or thereabouts when the input current Iin is 300nA. Contrary to this, it was acknowledged that the frequency response characteristics of the logarithmic amplifier of the present invention was improved up to approximately 1.5 MHz.

Figure 2:
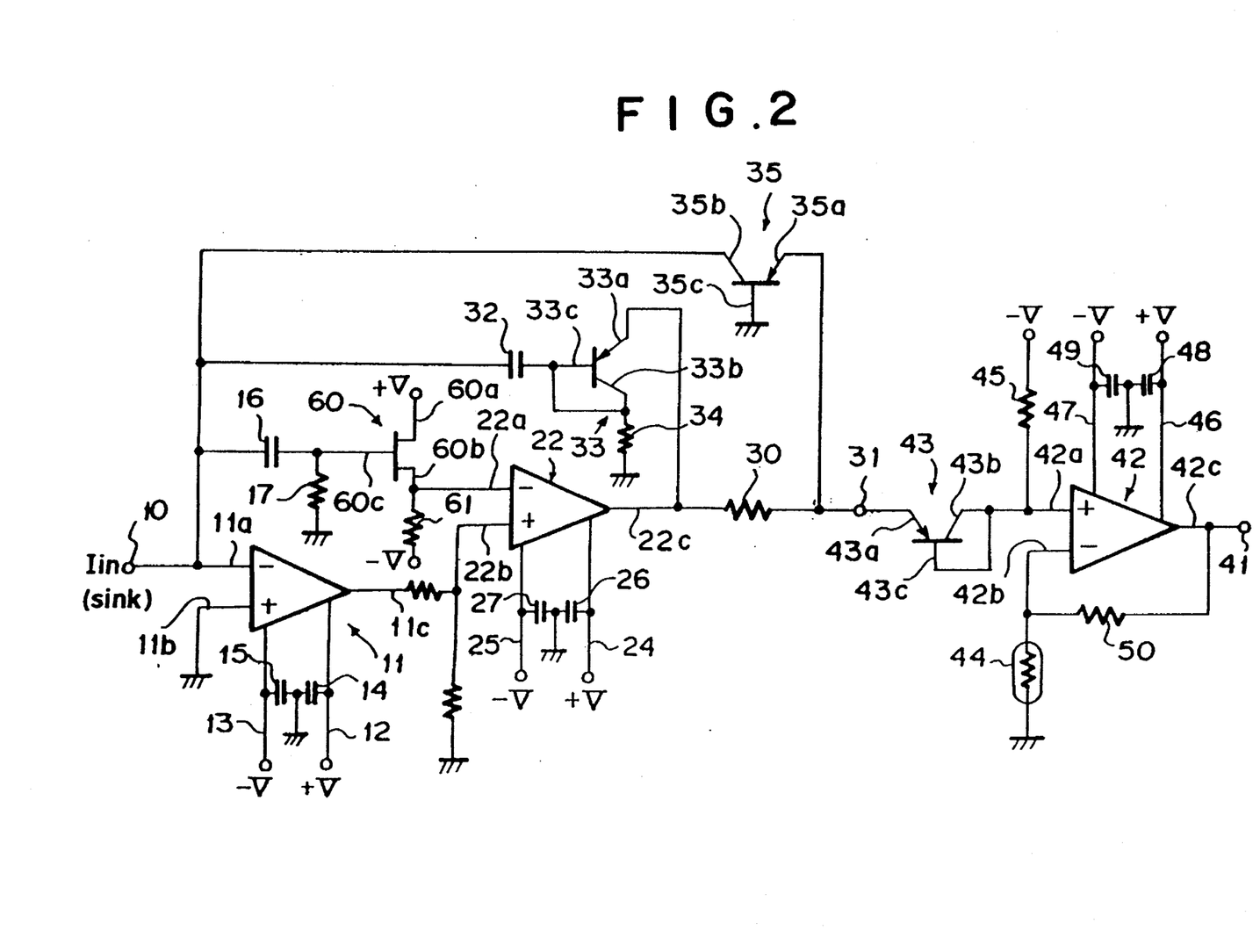
FIG. 2 is a circuit diagram showing a logarithmic amplifier according to a second embodiment of the present invention.

With reference to FIG. 2, a logarithmic amplifier according to a second embodiment of the present invention will now be described. In FIG. 2, the same reference numerals are provided to designate the corresponding features in FIG. 1, and hence the explanation thereof will be omitted here for brevity.

The logarithmic amplifier according to the second embodiment is different from the logarithmic amplifier in the first embodiment in that an input stage consisting of an FET 60 is added to the bipolar input type operational amplifier 22. In other words, a source 60b of the FET 60 is connected to the negative input terminal 22a of the bipolar input type operational amplifier 22, and a gate 60c of the FET 60 is connected to the input terminal 10 via the capacitor 16. A drain 60a of the FET 60 is connected to a +V power supply, whilst a drain 60b is connected to a −V power supply via a resistor 61.

In the above configuration, the influence of the input bias current and current noise of the bipolar input type operational amplifier 22 is suppressed by means of the input stage consisting of the FET 60, which ensures the prevention of errors and noise.

Figure 3:
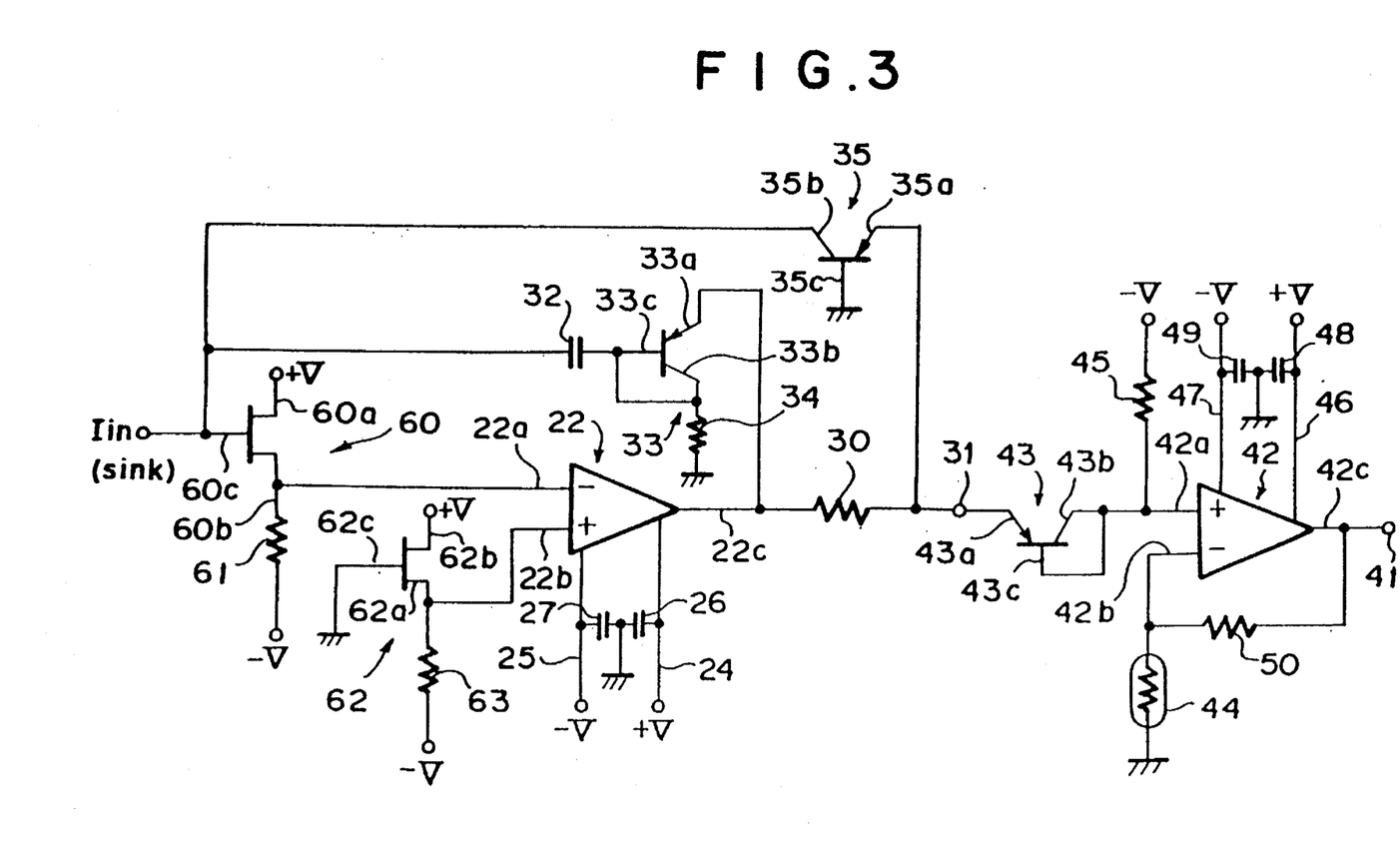
FIG. 3 is a circuit diagram showing a logarithmic amplifier according to a third embodiment of the present invention.

A logarithmic amplifier according to a third embodiment will now be described with reference to FIG. 3. The logarithmic amplifier according to the third embodiment is provided with the bipolar input type operational amplifier 22 instead of the FET input type operational amplifier, and the bipolar input type operational amplifier 22 is provided with an input stage consisting of FETs 60 and 62. In other words, the FET 60 similar to the FET used in the second embodiment is connected to the negative input terminal 22a of the bipolar input type operational amplifier 22. The gate 60c of the FET 60 is directly connected to the input terminal 10.

Moreover, a source 62a of the FET 62 is connected to the positive input terminal 22b of the bipolar input type operational amplifier 22. This source 62a is connected to the −V voltage power source via a resistor 63, whereas a drain 62b of the FET 62 is connected to the +V voltage power source. A gate 62c of the FET 62 is grounded.

In the above configuration, the use of the bipolar input type operational amplifier 22 having superior-high-speed characteristics results in improved high-speed response characteristics. On the other hand, the input stage consisting of the FETs 60 and 62 are provided on the input stage of the bipolar input type operational amplifier 22, and hence the influence of the input bias current and current noise of the bipolar input type operational amplifier 22 is suppressed, whereby the occurrence of significant errors and noise is also prevented.

Figure 4:
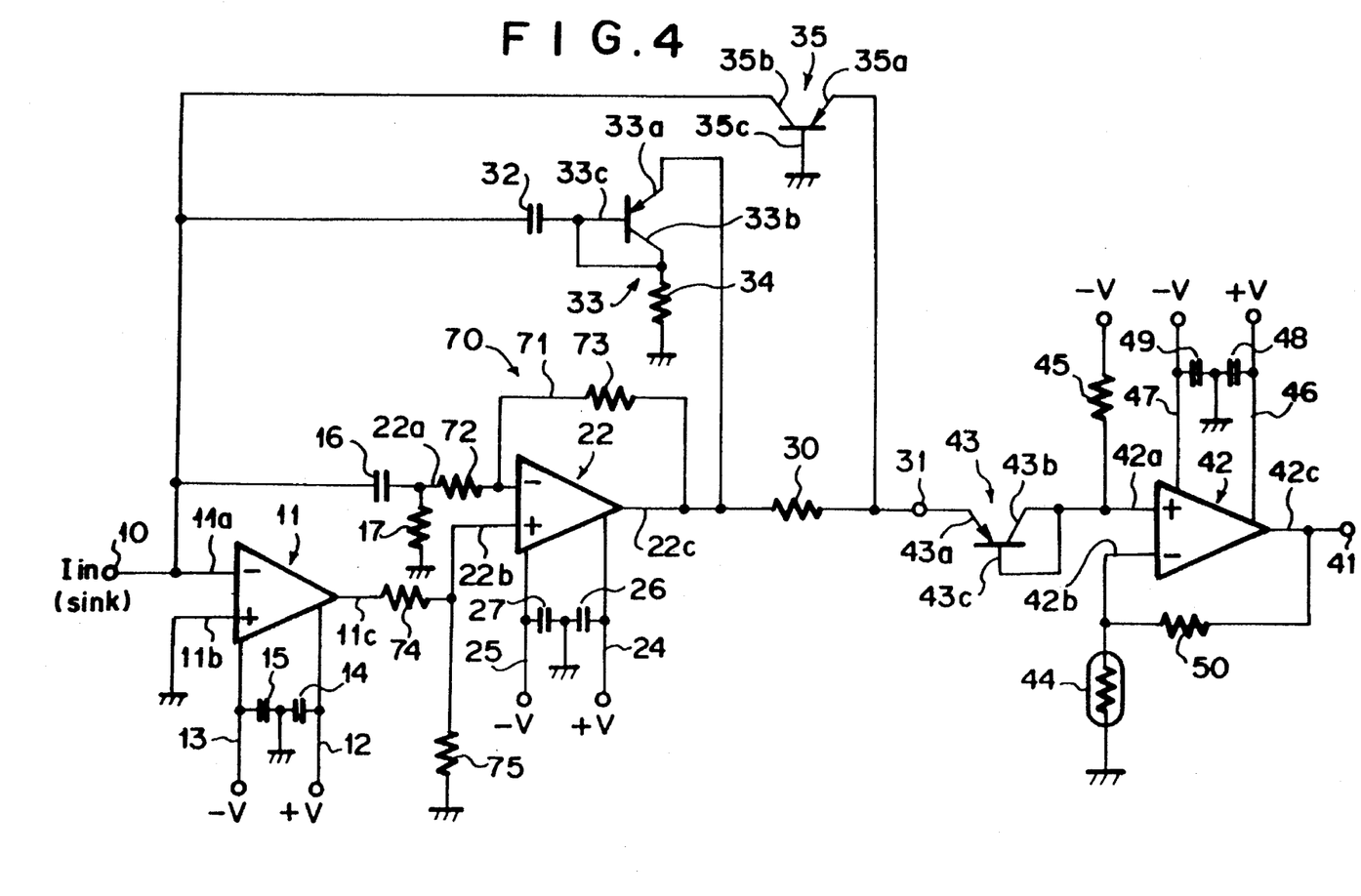
FIG. 4 is a circuit diagram showing a logarithmic amplifier according to a fourth embodiment of the present invention.

With reference to FIG. 4, there is shown a logarithmic amplifier according to a fourth embodiment of the present invention. The logarithmic amplifier of the fourth embodiment is basically different from the logarithmic amplifier of the first embodiment in that the bipolar input type operational amplifier 22 is provided with a minor feedback circuit 70. This minor feedback circuit 70 is made up of a feedback path 71, and resistors 72 and 73 for voltage dividing purposes.

In the logarithmic amplifier, the use of this minor feedback circuit 70 narrows the frequency domain covered by the bipolar input type operational amplifier 22 having relatively large current noise, thereby realizing the reduction of noise of the logarithmic amplifier.

On the assumption that the capacitance of a capacitor 16 is C1, and the resistances of resistors 74, 75, and 17 are R1, R2, and R3, when the bipolar input type operational amplifier 22 is provided with the minor feedback circuit 70, a time constant defined by C1/R3 and a damping factor of an output of the FET input type operational amplifier 11 defined by R1/R2 must be appropriately changed in accordance with an amplifying factor obtained as a result of minor feedback.

Figure 5:
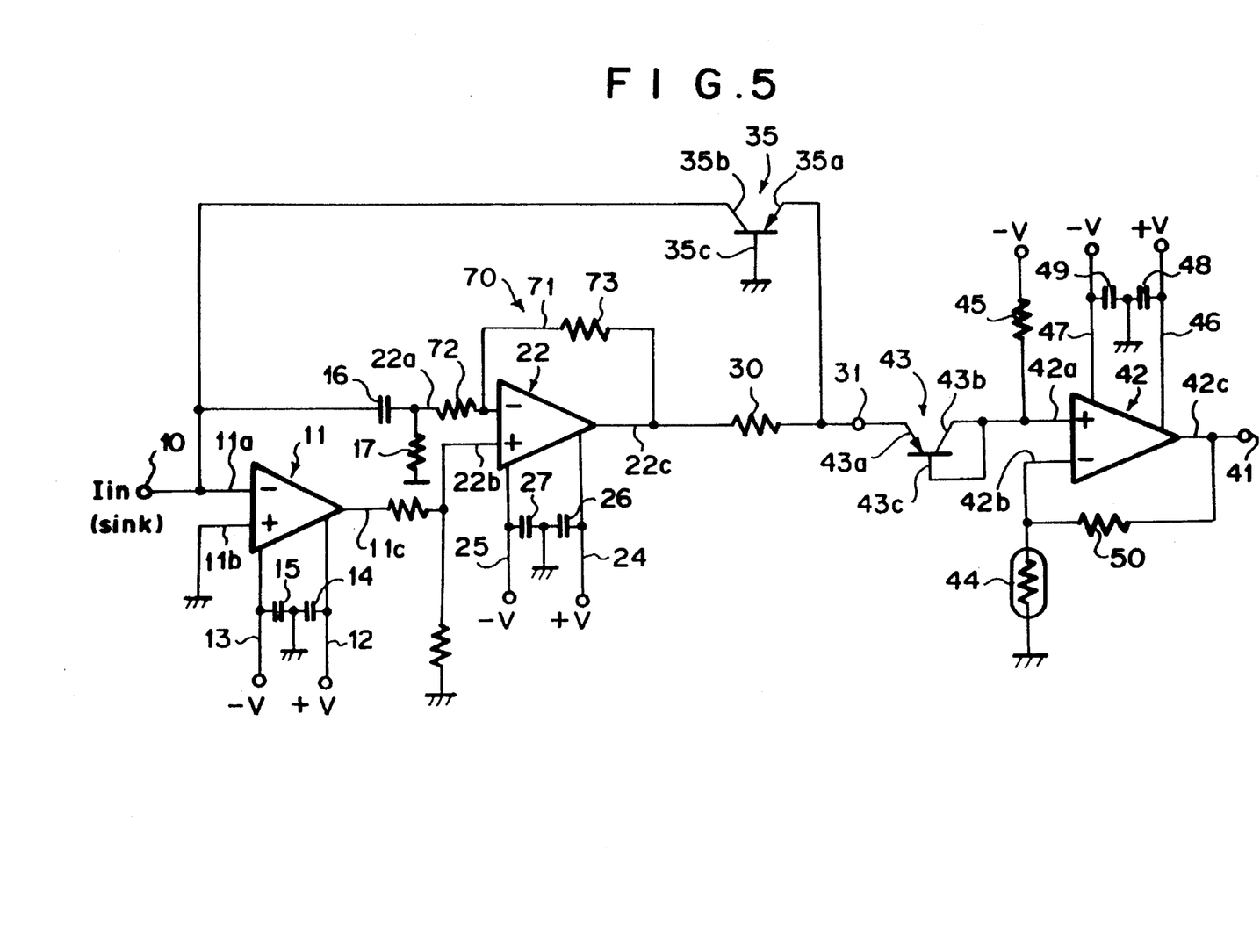
FIG. 5 is a circuit diagram showing a logarithmic amplifier according to a fifth embodiment of the present invention.

With reference to FIG. 5, a logarithmic amplifier according to a fifth embodiment of the present invention will be described. The logarithmic amplifier of the fifth embodiment is basically different from the logarithmic amplifier of the fourth embodiment in that it is provided with a control circuit comprising a transistor 33 for controlling the amount of feedback via a capacitor 32.

Even in this case, as with the logarithmic amplifier of the fourth embodiment, the use of this minor feedback circuit 70, consisting of the feedback path 71 and the resistors 72 and 73 for voltage dividing purposes, narrows the frequency domain covered by the bipolar input type operational amplifier 22 for high frequency use, thereby realizing the reduction of noise of the logarithmic amplifier.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without separating from the spirit and scope of the invention, be apparent to persons skilled in the art.

What is claimed is:

1. A logarithmic amplifier including an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller, the improvement being characterized by that the operational amplifier is made up of a composite operational amplifier including an FET input type operational amplifier and a bipolar input type operational amplifier.

2. The logarithmic amplifier as defined in claim 1, wherein an input stage made of an FET transistor is connected to ah input stage of the bipolar input type operational amplifier.

3. A logarithmic amplifier including an operational amplifier, an element for logarithmic conversion purposes connected to a feedback circuit of the operational amplifier, an oscillation prevention circuit having a capacitor connected in parallel with the logarithmic conversion element, and a control circuit for controlling the oscillation prevention circuit in such a way that the amount of feedback by way of the oscillation prevention circuit is reduced as an input current to the operational amplifier becomes smaller, the improvement being characterized by that the operational amplifier is a bipolar type operational amplifier connected to an input stage made of an FET transistor.

4. A logarithmic amplifier provided with an operational amplifier, an element for logarithmic conversion purposes connected to a first feedback circuit of the amplifier, and an oscillation prevention circuit having a capacitor connected in parallel with the logarithmic conversion element, the improvement characterized in that the operational amplifier is made of a composite amplifier which comprises an FET input type operational amplifier and a bipolar input type operational amplifier, and the bipolar input type operational amplifier is provided with a second feedback circuit which is different from the first feedback circuit connected to the logarithmic conversion element.

5. The logarithmic amplifier as defined in claim 4, further comprising a control circuit for controlling the oscillation prevention circuit in such a way that the amount of feedback by way of the oscillation prevention circuit is reduced as an input current to the operational amplifier becomes smaller.

* * * * *